US008283944B2

(12) United States Patent
Kuroda

(10) Patent No.: US 8,283,944 B2
(45) Date of Patent: Oct. 9, 2012

(54) ELECTRONIC CIRCUIT DEVICE

(75) Inventor: Tadahiro Kuroda, Tokyo (JP)

(73) Assignee: Keio University, Tokyo (JP)

( * ) Notice: Subject to any disclaimer, the term of this patent is extended or adjusted under 35 U.S.C. 154(b) by 34 days.

(21) Appl. No.: 12/995,757

(22) PCT Filed: Jun. 24, 2009

(86) PCT No.: PCT/JP2009/002885
§ 371 (c)(1),
(2), (4) Date: Dec. 2, 2010

(87) PCT Pub. No.: WO2010/001549
PCT Pub. Date: Jan. 7, 2010

(65) Prior Publication Data
US 2011/0102015 A1    May 5, 2011

(30) Foreign Application Priority Data
Jul. 4, 2008  (JP) .................. 2008-176120

(51) Int. Cl.
H03K 19/173   (2006.01)
G11C 5/06     (2006.01)
(52) U.S. Cl. ................ 326/37; 326/46; 365/63; 365/51; 365/201; 257/621; 257/686
(58) Field of Classification Search .................. 327/594; 365/63, 201, 227, 51, 191, 226, 222; 326/37–40, 326/46; 257/621, 686, 730, 777, 531, 690, 257/698, 723, 724
See application file for complete search history.

(56) References Cited

U.S. PATENT DOCUMENTS

| 5,603,042 A | 2/1997 | Kabenjian |
| 5,737,627 A | 4/1998 | Kabenjian |
| 7,546,106 B2 * | 6/2009 | Kuroda et al. ................ 455/292 |
| 7,631,238 B2 * | 12/2009 | Jung ............................. 714/738 |
| 7,768,790 B2 * | 8/2010 | Kuroda et al. ................ 361/760 |
| 2004/0215841 A1 | 10/2004 | Yamada et al. |
| 2005/0152169 A1 | 7/2005 | Goto |
| 2005/0289269 A1 | 12/2005 | Nakayama et al. |

(Continued)

FOREIGN PATENT DOCUMENTS

JP    A-08-503800    4/1996

(Continued)

OTHER PUBLICATIONS

Mizoguchi et al., "A 1.2 Gb/s/pin Wireless Superconnect Based on Inductive Inter-Chip Signaling (IIS)," *IEEE International Solid-State Circuits Conference*, Digest of Technical Papers, Feb. 17, 2004.

(Continued)

*Primary Examiner* — Vibol Tan
(74) *Attorney, Agent, or Firm* — Oliff & Berridge, PLC

(57) ABSTRACT

In the electronic circuit device with stacked plural components of the same function, this invention enables to select an arbitrary component among plural components by a control element, without setting pre-determined identification information in each component. By installing a sequential logic circuit in each component, and changing a state of the sequential logic circuit by control data transmitted from the component stacked in a preceding stage or the control element, the state of the controlled component is set to a state that accepts a selection made by the control element.

24 Claims, 9 Drawing Sheets

U.S. PATENT DOCUMENTS

| | | | |
|---|---|---|---|
| 2006/0001176 A1 | 1/2006 | Fukaishi et al. | |
| 2006/0043585 A1* | 3/2006 | Sukegawa et al. | 257/737 |
| 2007/0181991 A1 | 8/2007 | Ishino et al. | |
| 2007/0266184 A1 | 11/2007 | Yamada et al. | |
| 2007/0289772 A1* | 12/2007 | Kuroda et al. | 174/260 |
| 2008/0112242 A1* | 5/2008 | Jung | 365/201 |
| 2008/0150834 A1* | 6/2008 | Sukegawa et al. | 343/893 |
| 2010/0277995 A1* | 11/2010 | Choi | 365/201 |

FOREIGN PATENT DOCUMENTS

| | | |
|---|---|---|
| JP | A-10-040206 | 2/1998 |
| JP | A-2003-110086 | 4/2003 |
| JP | A-2004-326342 | 11/2004 |
| JP | A-2005-228981 | 8/2005 |
| JP | A-2005-348264 | 12/2005 |
| JP | A-2006-019328 | 1/2006 |
| JP | A-2006-040261 | 2/2006 |
| JP | A-2006-050354 | 2/2006 |
| JP | A-2006-066454 | 3/2006 |
| JP | A-2006-105630 | 4/2006 |
| JP | A-2006-173415 | 6/2006 |
| JP | A-2006-173986 | 6/2006 |
| JP | A-2007-157266 | 6/2007 |
| JP | A-2007-194444 | 8/2007 |
| WO | WO 03/103047 A1 | 12/2003 |

OTHER PUBLICATIONS

Miura et al., "Analysis and Design of Transceiver Circuit and Inductor Layout for Inductive Inter-chip Wireless Superconnect," *Symposium on VLSI Circuits*, Digest of Technical Papers, pp. 246-249, Jun. 2004.

Miura et al., "Cross Talk Countermeasures in Inductive Inter-chip Wireless Superconnect," *IEEE Custom Integrated Circuits Conference*, Oct. 2004.

Miura et al., "A 195Gb/s 1.2W 3D-Stacked Inductive Inter-Chip Wireless Superconnect with Transmit Power Control Scheme," *IEEE International Solid-State Circuits Conference*, Digest of Technical Papers, pp. 264-265, Feb. 8, 2005.

Miura et al., "A 1Tb/s 3W Inductive-Coupling Transceiver for Inter-Chip Clock and Data Link," *IEEE International Solid-State Circuits Conference*, Digest of Technical Papers, pp. 11-13, Feb. 8, 2006.

Miura et al., "A 0.14pJ/b Inductive-Coupling Inter-Chip Data Transceiver with Digitally-Controlled Precise Pulse Shaping," *IEEE International Solid-State Circuits Conference*, Digest of Technical Papers, pp. 358-359, Feb. 13, 2007.

Ishikuro et al., "An Attachable Wireless Chip Access Interface for Arbitrary Data Rate Using Pulse-Based Inductive-Coupling through LSI Package," *IEEE International Solid-State Circuits Conference*, Digest of Technical Papers, pp. 360-361, Feb. 13, 2007.

Miura et al., "An 11 Gb/s Inductive-Coupling Link with Burst Transmission," *IEEE International Solid-State Circuits Conference*, Digest of Technical Papers, pp. 298-299, Feb. 5, 2008.

International Search Report issued in Application No. PCT/JP2009/002885; Dated Oct. 13, 2009 (With Translation).

Written Opinion of the International Searching Authority issued in Application No. PCT/JP2009/002885; Dated Oct. 13, 2009 (With Translation).

* cited by examiner (a)

(b)

(a)

(b)

ELECTRONIC CIRCUIT DEVICE

TECHNICAL FIELD

This invention is to constitute an electronic circuit of a predetermined scale by connecting in a cascade plural components that perform the same function to a vertical direction or to a lateral direction, and it is related with an electronic circuit device that enables to select a desired component and direct an execution of a function, without assigning an identification number specific to each component.

TECHNICAL BACKGROUND

Recently, a large capacity semiconductor memory device built by stacking plural semiconductor memories, and controllable from the outside as one semiconductor memory is developed.

For example, a solid state drive (SSD) using nonvolatile memory instead of a magnetic hard disk drive increases memory capacity by stacking the plural same flash memory chips.

By stacking 32 chips of 1 GB NAND flash memory and one control chip in the same package, it is possible to access from the outside as a 32 GB NAND flash memory.

Similarly, it is possible to increase a memory capacity of such DRAM by stacking DRAM chips.

Moreover, by stacking plural microprocessor chips into multilayer stages, it is possible to use as a multi-core processor.

As for a technology that connects wirelessly between multi-layered chips in a stacked semiconductor device or between stacked printed-circuit boards, the inventor of this invention proposed an electronic circuit performing a communication by inductive coupling between chips implemented by stacking or between stacked printed circuit boards using coils formed by wiring on the chips or on the printed circuit boards (refer to the Patent Documents 1-7 and Non-Patent Documents 1-8.).

PRIOR ART DOCUMENTS

Patent Documents
[Patent Document 1] JP-A-2005-228981
[Patent Document 2] JP-A-2005-348264
[Patent Document 3] JP-A-2006-050354
[Patent Document 4] JP-A-2006-066454
[Patent Document 5] JP-A-2006-105630
[Patent Document 6] JP-A-2006-173986
[Patent Document 7] JP-A-2006-173415
[Patent Document 8] JP-A-2003-110086
[Patent Document 9] JP-A-2007-157266
Non-Patent Documents
[Non-Patent Document 1] D. Mizoguchi et al and "A 1.2 Gb/s/pin Wireless Superconnect based on Inductive Inter-chip Signaling (IIS)" IEEE International Solid-State Circuits Conference (ISSCC'04), Dig. Tech. Papers, pp. 142-143, 517, Feb. 2004.
[Non-Patent Document 2] N. Miura et al and "Analysis and Design of Transceiver Circuit and Inductor Layout for Inductive Inter-chip Wireless Superconnect" Symposium on VLSI Circuits, Dig. Tech. Papers, pp. 246-249, Jun. 2004.
[Non-Patent Document 3] N. Miura et al and "Cross Talk Countermeasures in Inductive Inter-Chip Wireless Superconnect" in Proc. IEEE Custom Integrated Circuits Conference (CICC'04), pp. 99-102, Oct. 2004.
[Non-Patent Document 4] N. Miura and D. Mizoguchi and M. Inoue, H. Tsuji and T. Sakurai, and T. Kuroda and "A 195 Gb/s 1.2 W 3D-Stacked Inductive Inter-Chip Wireless Superconnect with Transmit Power Control Scheme" IEEE International Solid-State Circuits Conference (ISSCC'05), Dig. Tech. Papers, pp. 264-265, Feb. 2005.
[Non-Patent Document 5] N. Miura and D. Mizoguchi and M. Inoue, K. Niitsu and Y. Nakagawa, M. Tago and M. Fukaishi, T. Sakurai and T. Kuroda, "A 1 Tb/s 3 W Inductive-Coupling Transceiver for Inter-Chip Clock and Data Link" IEEE International Solid-State Circuits Conference (ISSCC'06), Dig. Tech. Papers, pp. 424-425, Feb. 2006.
[Non-Patent Document 6] N. Miura and H. Ishikuro and T. Sakurai, and T. Kuroda and "A 0.14pJ/b Inductive-Coupling Inter-Chip Data Transceiver with Digitally-Controlled Precise Pulse Shaping" IEEE International Solid-State Circuits Conference (ISSCC'07), Dig. Tech. Papers, pp. 264-265, Feb. 2007.
[Non-Patent Document 7] H. Ishikuro, S. Iwata and. T. Kuroda, "An Attachable Wireless Chip Access Interface for Arbitrary Data Rate by Using Pulse-Based Inductive-Coupling through LSI Package" IEEE International Solid-State Circuits Conference (ISSCC'07), Dig. Tech. Papers, pp. 360-361,608, Feb. 2007.
[Non-Patent Document 8] N. Miura and Y. Kohama and Y. Sugimori, H. Ishikuro and T. Sakurai, and T. Kuroda and "An 11 Gb/s Inductive-Coupling Link with Burst Transmission" IEEE International Solid-State Circuits Conference (ISSCC08), Dig. Tech. Papers, pp. 298-299, Feb. 2008.

SUMMARY OF INVENTION

Problem to Be Solved by the Invention

Using an invention described in JP-A-2005-228981 (Patent Document 1), it is possible to stack plural chips of the same kind, supply power by conventional wire-bonding, and to perform communications by inductive coupling between chips.

As for a method for selecting and operating a desired chip among stacked plural chips, there is a method that by assigning information about a stacked position to each chip as a unique chip identification number, sending a chip-select address to all the chips, and the each chip comparing the chip-select address with the chip identification number, the desired chip is identified and selected.

For example, when each chip has an identification number of unique 8 bits, it is possible to distinguish and select 256 chips.

When each chip is different, it is easy to embed a chip identification number in a manufacturing process of each chip.

However, in the case that the same chips are stacked, it is necessary to embed a different chip identification number according to a position to be stacked, and it is not simple.

When a position to stack each chip is pre-determined, it is possible to embed a chip identification number in the manufacturing process of each chip.

For example, in the case of a flash memory, it is sufficient to write a chip identification number in a specific domain of a flash memory during a step of testing each chip and selecting good chips.

Or in the case of DRAM, it is possible to write a chip identification number by cutting a fuse using a laser.

Because in DRAM, when a defective bit is detected, the defective bit line is replaced with a spare bit line by irradiating a laser and cutting a fuse of a redundancy circuit.

However, by such a method, manufacturing process steps increase and production cost rises.

Moreover, because it is necessary to stack chips with the same appearance that have chip identification numbers defining pre-determined stacking order in pre-determined positions, additional process of sorting and arranging chips in a right order is necessary in stacking processes, and cost becomes high.

Furthermore, since manufacturing yields of chips with each stacking order are generally different, surplus and shortage of chips with each stacking order are easily generated and production control is difficult. It is a factor leading to high cost.

On the other hand, even if chips are the same completely, it is possible to set information about a stacking order to a chip using bonding-wires in the chip stacking process.

For example, using two bonding-wires and by giving voltages of (GND, GND) to the first chip, and (GND, VDD) to the second chip, (VDD, GND) to the third chip, and (VDD, VDD) to 4th chip, it is possible that each chip recognize the order being stacked.

However, in the case that the number of stages to stack chips is 64, this method needs 6 bonding-wires, and 6*64=384 bonding-wires are needed for all the chips in total.

When executing a lot of wire-bonding, the processing cost of stacking becomes high or stacking process becomes difficult.

Therefore, there are following inventions that assign chip identification numbers specific to each chip without embedding a chip identification number in a manufacturing process or giving a chip identification number by wire-bonding in a packaging process.

An invention described in JPA-2003-110086 (Patent Documents 8) is to generate a specific chip identification number using a manufacturing variation of each semiconductor chip, such as charge time to a parasitic capacitance, but it isn't necessarily possible to obtain different chip control numbers.

Moreover, an invention described in JPA2007-157266 (Patent Documents 9) is that an arithmetic circuit installed in each chip generates a chip identification number, when chips are stacked and connected in a cascade.

For example, an increment arithmetic circuit that generates an output value (S0, S1, S2) of 3 bits by adding 1 to an input value (A0, A1, A2) of 3 bits is installed in each chip, and according to the stacking order of each chip, the increment arithmetic circuits are connected in the cascade, as a result, a connection path that an output (S0, S1, S2) of a preceding stage becomes an input (A0, A1, A2) of a latter stage is formed, and an individual chip identification number is assigned to each chip.

Furthermore, a comparator that compares a chip-select address connected to all the chips commonly and the chip identification number of each chip is installed. The comparator sends out a chip selection signal when a matching is detected.

In the above-mentioned conventional method, since the maximum number of stacks of chips is fixed by the number of bits of an arithmetic circuit prepared beforehand, it is impossible to stack chips more than the fixed maximum number.

For example, since it is 3 bits in the above-mentioned example, it is only possible to stack chips up to 8 at the maximum.

To stack more chips, it is necessary to re-design a circuit. Or in order to secure the larger upper limit number of stacking chips beforehand, it is necessary to make the number of bits of an arithmetic circuit larger than necessary, and costs of operation and communication become high.

Furthermore, the inventions of JPA-2003-110086 (Patent Documents 8) and JPA-2007-157266 (Patent Documents 9) need to form common connection paths to all the chips, for selecting a desired semiconductor chip by sending a chip-select address to all the chips and comparing it with the chip identification number of each chip.

When making connection by inductive coupling, an accessible distance is about a diameter of a coil.

Therefore, for forming a common connection path to all the chips, it is necessary for a coil to have the diameter equivalent to a distance of all the stacked chips in the direction of chip thickness.

When a thickness of a chip is 50 micrometers, by stacking 64 chips, the thickness becomes more than 3 mm.

In this case, to form a common connection path to all the chips, a coil with the diameter more than 3 mm is necessary, and it becomes expensive to integrate this on a chip of around 10 mm square.

Moreover, since a chip-select address is sent to all the chips even when communicating with a relatively nearby chip, unnecessary power is consumed.

Moreover, in the case that attachable/removable boards are stacked, it is necessary to regenerate board identification numbers at every attachment/removal of a board, which requires additional power.

In view of the above mentioned problem, this invention is to provide a stacked device that is constituted by stacking the desired number of electronic circuit elements that are classified as the same kind, or 2 to 3 kinds, such as semiconductor chips or devices, to a vertical direction or to a lateral direction, and that it is possible to select a desired electronic circuit element and communicate with it.

Moreover, it aims to provide a configuration that enables to select a desired electronic circuit element among stacked plural electronic circuit elements with small power consumption.

And, it aims to apply to an electronic circuit that can connect and communicate selectively with a desired electronic circuit element among stacked plural electronic circuit elements by contact of terminals, optical connections, or electromagnetic coupling.

Means for Solving a Problem

This invention is to connect in a cascade the arbitrary number of components that perform the same function to a vertical direction or to a lateral direction, and each component has a sequential logic circuit and a means for communicating with a preceding component and a latter component of the stacked components.

The sequential logic circuit of each component determines a next internal state based on a present internal state of the component and a control signal received from the preceding component.

Moreover, each component has a configuration that determines processing details of the component itself based on the internal state that the sequential logic circuit determined, and execute such process.

The Effect of the Invention

This invention makes it possible to constitute an electronic circuit device that has an arbitrary capability by stacking the arbitrary number of components of the same function.

It is unnecessary to assign an identification number to each component in a configuration of this invention.

Therefore, when adding or deleting a component and changing a capability of the entire device, it is not necessary to re-design the component and it is possible to realize low cost, Moreover, it is not necessary to transmit information for selection to all the stacked components, so that it is possible to drive the device with low power.

EMBODIMENT 1

Figure 1:
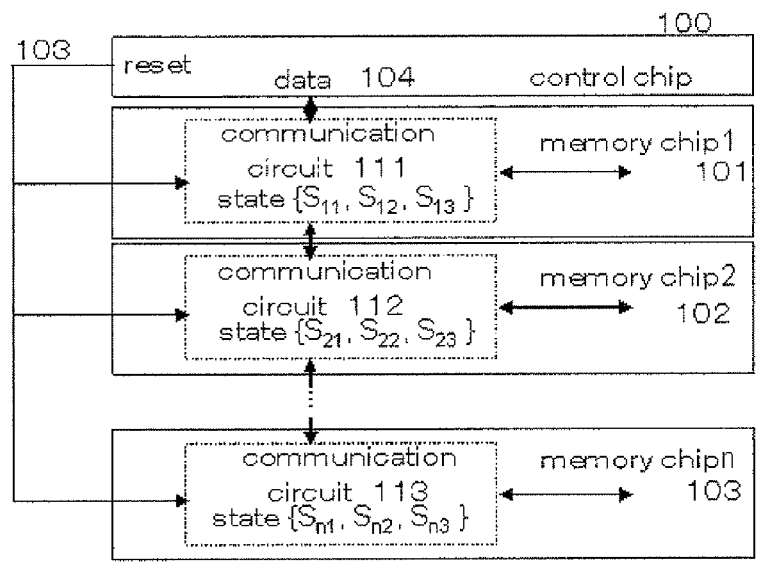
[FIG. 1] (a) is a figure showing the first embodiment of this invention, and (b) is a detailed view of memory chips of the first embodiment.
Figure 1:
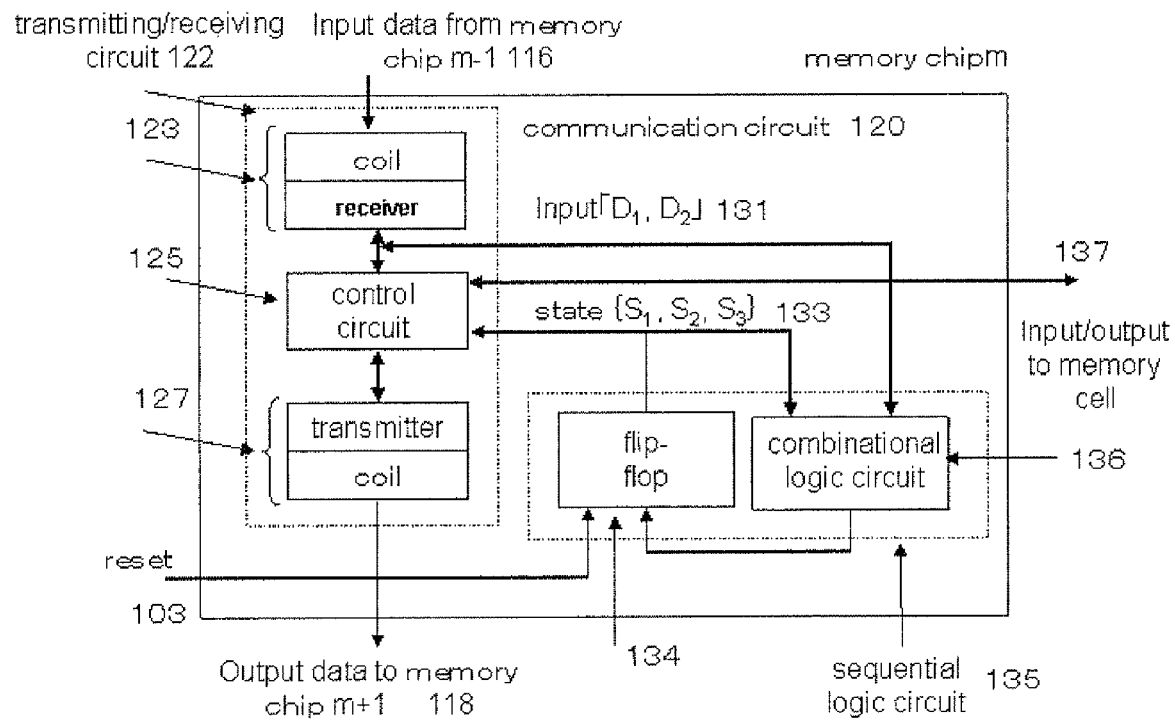

FIG. 1 is a figure showing the first embodiment of this invention, and to constitute a large capacity memory circuit device by stacking the arbitrary number of memory chips of predetermined memory capacity.

At the front row of the stacked memory chips, a control chip as a control element that controls each memory chip is stacked.

This embodiment is a configuration that uses an inductive coupling as a means of communication between the control chip and the memory chips.

FIG. 1(a) is a figure showing an entire configuration of this embodiment, n memory chips (memory chips 1 to n) of the same function are stacked, and a control chip 100 is stacked at the front row of the memory chips.

Communication circuits 111 to 113, which are not illustrated, memory cells of predetermined capacity, and a read/write control circuit are integrated in the memory chips.

A transmitting/receiving circuit is installed in the communication circuit.

This embodiment communicates by inductive coupling and it is possible to set a communication distance to an arbitrary value.

A receiving circuit in the transmitting/receiving circuit of the memory chip m receives a signal from the memory chip m−y, and sends it to a control circuit of the memory chip m.

Moreover, a transmitting circuit of the memory chip m transmits data of the control circuit to a memory chip m+x.

When the memory chip m is in a transfer state, it transfers (relays) signals from the memory chip m−y to the chip m+x by transmitting the signals that the receiving circuit received, using the transmitting circuit.

By the transmitting/receiving circuit of this embodiment, a transmitting/receiving procedure that receives a signal from the preceding component and transmits it to the latter component, and a transmitting/receiving procedure that receives a signal from the latter component and transmits it to the preceding component are possible.

As for the above-mentioned "x" and "y", both a positive integer and a negative integer are possible, however in the following, it is explained by a case that both "x" and "y" are 1.

A reset signal 103 is sent in parallel from a control chip 100 to each memory chip.

Each memory chip that received the reset signal 103 initializes a communication circuit in the memory chip.

A data input/output portion 104 of the control chip 100 is coupled with a communication circuit 111 of a memory chip 1 by inductive coupling.

The communication circuit 111 of the memory chip 1 is coupled with a communication circuit 112 of a memory chip 2 stacked in the latter stage by inductive coupling.

Similarly, the memory chip in is coupled with a communication circuit of a memory chip m−1 stacked in a preceding stage and to a communication circuit of a memory chip m+1 stacked in a latter stage by inductive coupling.

The memory chip n of the last stage is coupled only with a communication circuit of a memory chip n−1 stacked in a preceding stage.

When accessing a memory cell integrated in the specific memory chip m among the n memory chips, the control chip 100 sets the memory chip m to a selective state by sending control data that selects the memory chip m from the data input/output portion 104.

Next, the control chip 100 sends an address of the memory cell which is to be accessed and a read/write control signal, and executes read/write of data to the above-mentioned address.

FIG. 1(b) is a figure showing a configuration of the memory chip m.

The communication circuit 120 includes a transmitting/receiving circuit 122 and a sequential logic circuit 135.

The transmitting/receiving circuit 122 includes a receiving circuit 123 that is connected by inductive coupling to a transmitting/receiving circuit of the preceding memory chip m−1, a transmitting circuit 127 that is connected by inductive coupling to a transmitting/receiving circuit of the latter memory chip m+1, and a control circuit 125 controlling the entire communication circuit 120.

The sequential logic circuit 135 includes flip-flops 134 that store a 3 bits state information {S1, S2, S3} 133 indicating an operational state of the memory chip, and a combinational logic circuit 136.

According to a value of the flip-flops 134 and a 2 bits control information (D1, D2) that the preceding memory chip m−1 (the control chip 100 for the memory chip 1) transmitted and the transmitting/receiving circuit 122 received, the combinational logic circuit 136 determines a operational state that the memory chip m should take next, and stores corresponding state information in the flip-flops 134.

The control circuit 125 determines an operation of the memory chip m based on the state information {S1, S2, S3}, and controls the whole memory chip m.

The control circuit 125 includes a signal line 137 through which read/write control signals for memory cells of a memory chip and address information are transmitted, and read data and write data are exchanged.

Figure 2:
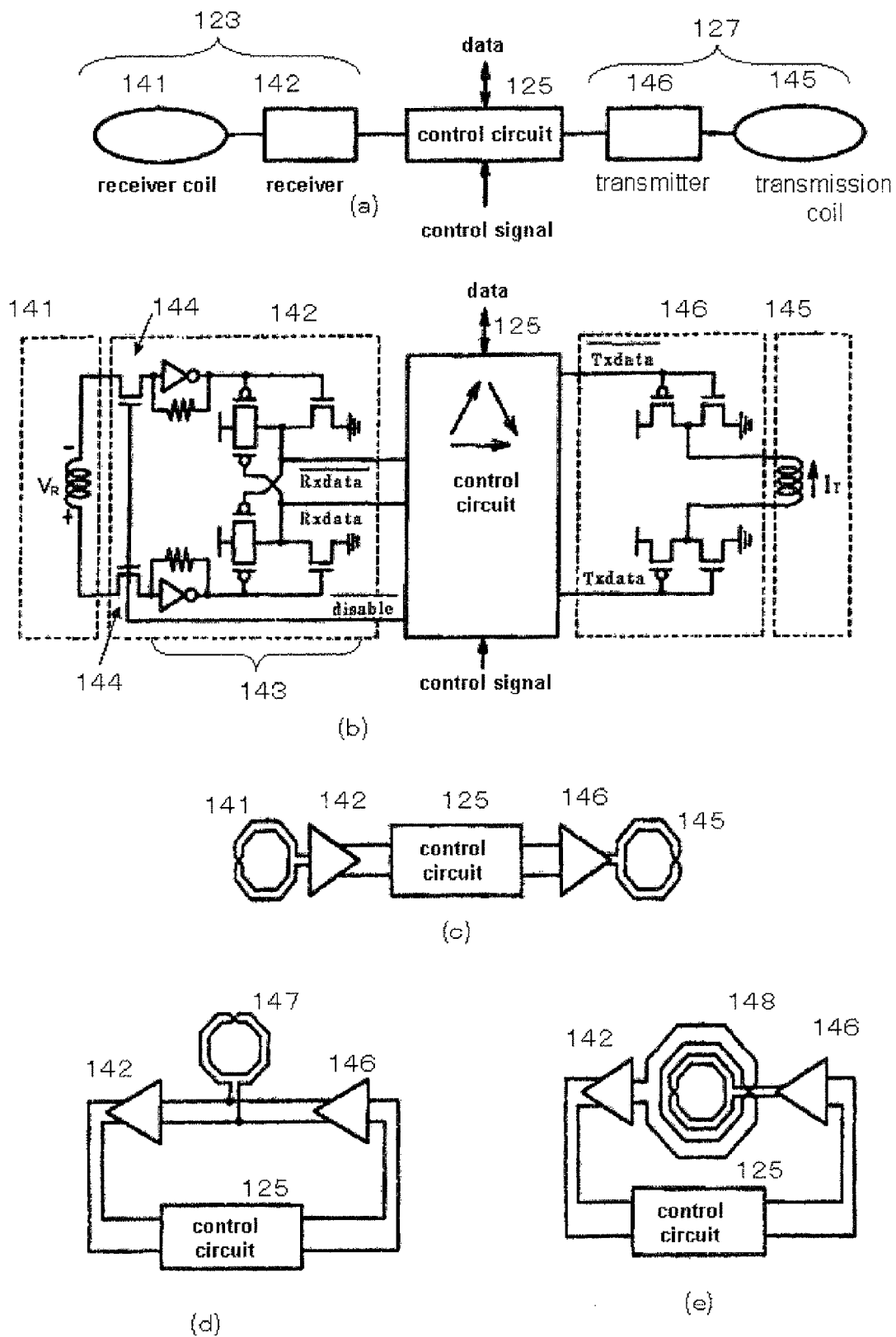
[FIG. 2] (a) is a schematic of a transmitting/receiving circuit using inductive coupling, (b) is its detailed view, (c), (d), and (e) are figures showing examples of configurations of transmission coils and receiver coils.

FIG. 2(a) is an example of a circuit of the transmitting/receiving circuit 122 in FIG. 1, and FIG. 2(b) is a detailed view of the transmitting/receiving circuit 122.

The transmitting/receiving circuit 122 consists of the receiving circuit portion 123, the transmitting circuit portion 127, and the control circuit 125.

The receiving circuit portion 123 consists of a receiver coil 141 and a receiver 142, and the transmitting circuit portion 127 consists of a transmission coil 145 and a transmitter 146.

The control circuit 125 controls a receiver 142, a transmitter 146, and a memory cell based on the state information 133 shown in FIG. 1, and it controls transfer of data by the receiving circuit portion 123 and the transmitting circuit portion 127.

For a data exchange, there are an operation of transmitting data received through the receiver circuit portion 123 to internal circuits such as a memory cell, similarly, an operation of transferring (relaying) received data to a memory chip of the next stage through the transmitting circuit portion 127, and an operation of transmitting data of internal circuits such as a memory cell to a memory chip of the next stage (or the control chip 100).

FIG. 2(b) shows an example of circuits of the receiver 142 and the transmitter 146.

The receiver 142 consists of an amplifier circuit 143 that sends [Rxdata] to the control circuit 125 after amplifying a voltage (VR) generated in the receiver coil 141 by inductive coupling, and a gate circuit 144 that controls ON/OFF between the amplifier circuit 143 and the receiver coil 141.

The gate circuit 144 is controlled by a [disable] signal from the control circuit 125.

When the gate circuit 144 is ON, the receiving circuit portion 123 is in a receiving state, and the amplifier circuit 143 amplifies a signal that the receiver coil 141 received, and passes it to the control circuit.

When the control circuit 125 sends a [disable] signal, the gate circuit 144 becomes OFF, the amplifier circuit 143 and the receiver coil 141 are separated, and the receiving operation becomes non-active (disabled).

The transmitter 146 controls the direction of a pulse current ($I_T$) that flows in the transmission coil 145 according to "1" and "0" of a data signal [Txdata] that is sent from the control circuit 125, and it generates inductive coupling corresponding to the output signal, between the receiver coil of the next stage.

In addition, this figure shows only one receiving circuit portion and only one transmitting circuit portion, but it is possible to set the arbitrary number as necessary.

FIG. 2(c) to FIG. 2(e) are figures showing examples of arrangements of a receiver coil and a transmission coil.

FIG. 2(c) shows a configuration arranging the receiver coil 141 and the transmission coil 145 individually.

Using this configuration, it is possible to take arbitrary installation positions of the receiver coil 141 and the transmission coil 145, and it becomes possible to reduce interference between each coil.

FIG. 2(d) shows a configuration using one coil 147 as both a transmission coil and a receiver coil, and using it by switching at a time of transmitting and receiving.

A coil 148 of FIG. 2(e) is a configuration that a transmission coil and a receiver coil are arranged coaxially.

Configurations of FIG. 2(d) and FIG. 2(e) are that at a transmitting time, a transmitting circuit 146 is driven and a receiving circuit 142 is set non-active, and at a receiving time, the receiving circuit 142 is driven and the transmitting circuit 146 is set non-active, therefore mutual interferences are prevented.

Figure 3:
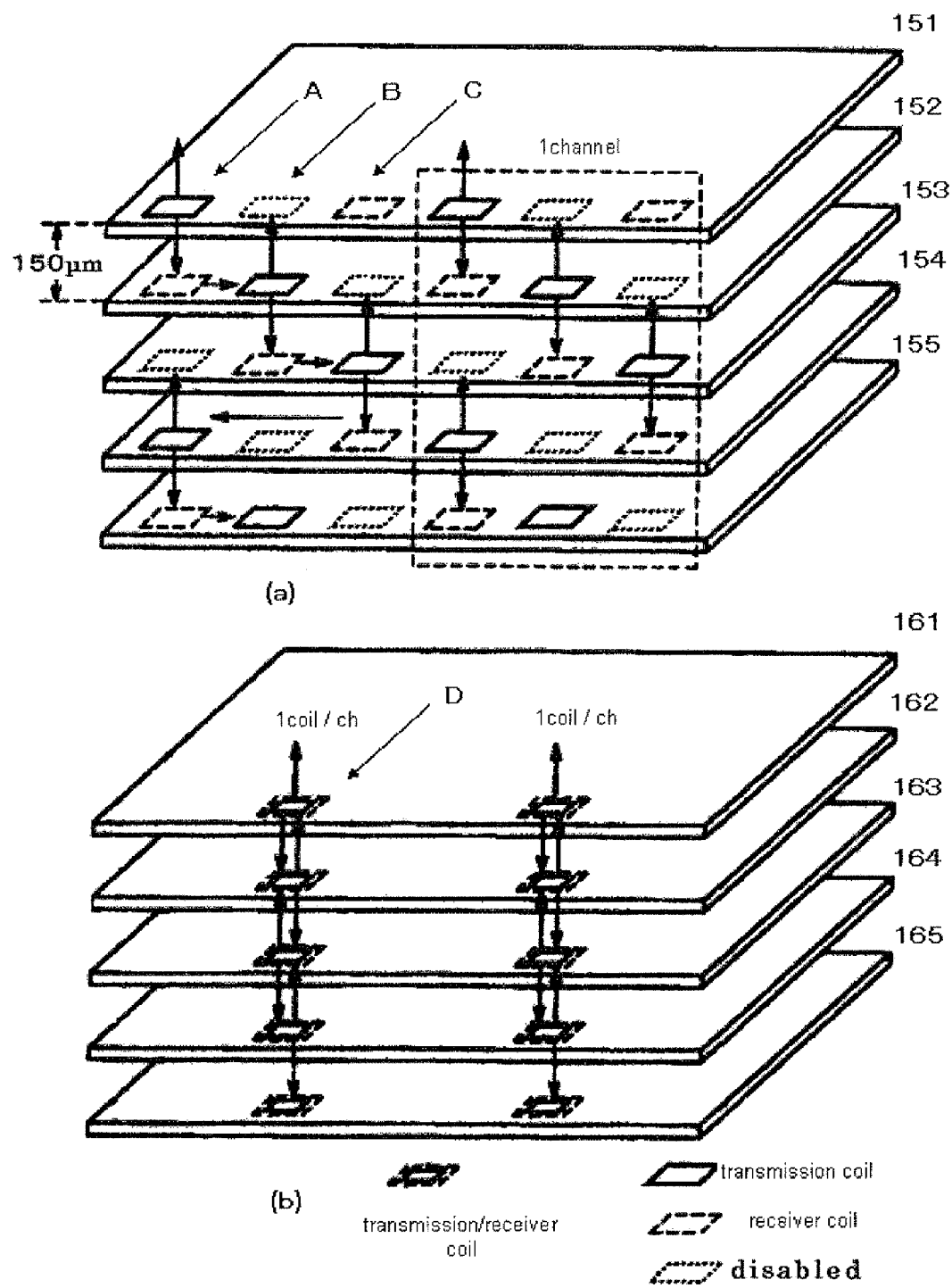
[FIG. 3] (a) is a figure showing the first example that stacks components using inductive coupling, (b) is a figure showing the second example that stacks components using inductive coupling.

FIG. 3 is a figure showing a data exchange among stacked five memory chips.

FIG. 3(a) is an example of a three coils type channel that one channel is constituted with three coils, and FIG. 3(b) is an example of a one coil type channel that one channel is constituted with one coil or one coaxial coil shown in FIG. 2(d) or FIG. 2(e).

In addition, components other than coils, such as a receiver, a transmitter, and a control circuit, are not shown the figure.

A distance between the stacked chips is shorter than a distance that the transmission coil and the receiver coil are connected by inductive coupling, and stacked at a distance of 150 micrometers in this figure.

The three coil type channel shown in FIG. 3(a) is constituted by one transmission coil and two receiver coils, one of the two receiver coils is set to a receiving state, and another receiver coil is set to a non-active state.

A coil A of a chip 151 is a transmission coil, a coil B is a receiver coil set to a non-active state, and a coil C is a receiver coils set to a receiving state.

Moreover, a coil A of a chip 152 is a receiver coil set to a receiving state, a coil B is a transmission coil, and a coil C is a receiver coil set to a non-active state.

When a control circuit of the chip 151 drives the transmission coil A through a transmitter, the receiver coil A set to the receiving state of the chip 152 detects a signal by inductive coupling, and passes the received signal (Rxdata) to a control circuit of the chip 152.

By this operation, the data is transmitted from the chip 151 to the chip 152.

The control circuit of the chip 152 drives the transmission coil B of the chip 152 based on the transmitting signal.

Inductive coupling of the transmission coil B reaches the receiver coil B of the chip 151 and the receiver coil B of the chip 153.

Since the receiver coil B of the chip 151 is set to a non-active state, it does not detect the signal.

On the other hand, since the receiver coil B of the chip 153 is set to a receiving state, it detects the signal and passes it to the control portion of the chip 153.

By the above-mentioned operation, transmitting of data from the chip 152 to the chip 153 is performed.

Next, transmitting of data from a transmission coil C of the chip 153 to a receiver coil C set to a receiving state of a chip 154 is performed, and then transmitting of data from a transmission coil A of the chip 154 to a receiver coil A set to a receiving state of a chip 155 is performed.

This configuration and operations enable the control chip 100 of FIG. 1 to transmit data to the memory chips 1 to n.

In FIG. 3(a), it is possible to transmit data from the chip 155 to the direction of the chip 151 by changing a setting of each receiver coil that forms a channel.

For example, by setting the receiver coil B of the chip 151 to an operating state, and the receiver coil B of the chip 153 to a non-active state, the inductive coupling by the transmission coil B of the chip 152 is detected by the receiver coil B of the chip 151, and the data is transmitted from the chip 152 to the chip 151.

By this configuration, the memory chips 1 to n of FIG. 1 are able to transmit data to the control chip 100.

FIG. 3(b) is an example that performs transmitting/receiving of data by a one coil type channel constituted with one coil or one coaxial coil.

D in FIG. 3(b) is an one coil type channel, and it performs transmitting/receiving of data between chips by a transmitting/receiving circuit that has a system that a coil works both as a transmission coil and a receiver coil as shown in FIG.

2(d), or a system that a transmission coil and a receiver coil are arranged coaxially as shown in FIG. 2(e). In FIG. 3(b), when transmitting data from a chip 162 to a chip 163, the coil D of the chip 162 is set to a transmitting state, the coil D of the chip 161 is set to a non-active state, and the coil D of the chip 163 is set to a receiving state.

By driving the coil D of the chip 162 with transmitting data, inductive coupling is generated in the coil D of the chip 161 and the coil D of the chip 163.

Since the coil D of the chip 161 is set to a non-active state, the chip 161 does not receive the data from the chip 162.

On the other hand, the coil D of the chip 163 is set to a receiving state, and it receives the data from the chip 162 by the inductive coupling.

Therefore, it is possible to transmit the data from the chip 162 to the chip 163 by setting the coil D of the chip 161 to the non-active state, and the coil D of the chip 163 to the receiving state.

Moreover, it is possible to transmit data from the chip 162 to the chip 161 by setting the coil D of the chip 163 to a non-active state, and the coil D of the chip 161 to a receiving state.

By using one coil type channels for all channels that transmit and receive data between chips, the structures of the coils of each chip could be the same, therefore, it is possible to make all the chips that are stacked to have the same function and the identical structure.

A configuration shown in FIG. 1 is a configuration stacking plural memory chips.

The control chip 100 performs writing/reading data, by selecting a memory chip to read/write data, sending an address of memory cell in chip to read/write data to the selected chip, and giving orders to read/write data.

Each memory chip has plural operating states such as a state being selected by the control chip 100 and performing read/write of data, and a state relaying data such as an address to be transmitted between the selected memory chip and the control chip 100, and it determines a operating state that should be taken next based on a control data that the control chip 100 has transmitted and a present operating state.

In the example shown in FIG. 1 a state of each memory chip is determined by the 3 bits stored in the flip-flops 134 of the sequential logic circuit 135.

The combinational logic circuit 136 calculates the 3 bits data indicating an operating state that the memory chip should take next, based on a 2 bits data "D1, D2" received by the receiving circuit and the 3 bits state information {S1, S2, S3} that the flip-flops 134 store, and stores it in the flip-flops 134.

Moreover, the control circuit 125 receives the 3 bits state information stored in the flip-flops 134, and performs an operation indicated by this state information.

When the control chip 100 directs read/write of data to a specific memory chip, it sends a reset signal to all the memory chips through a reset line 103, and resets the flip-flops 134 of each memory chip.

By this reset operation, the state of all the memory chips is set to an initial state.

The control chip 100 sends a 2 bits data "D1, D2" to the stacked memory chip through a data channel 104 following the above-mentioned reset operation.

Figure 4:
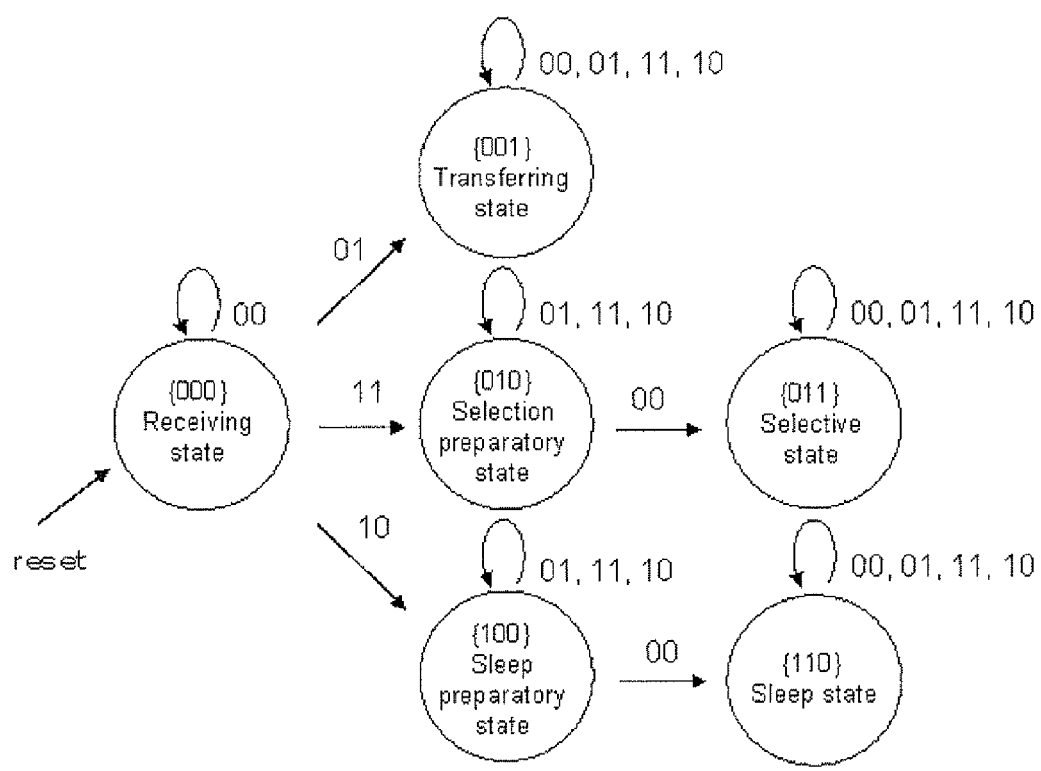
[FIG. 4] A state transition diagram of the first embodiment.

FIG. 4 is a figure showing a state transition of the sequential logic circuit 135 by the 2 bits data "D1, D2."

Receiving State {000}:

The flip-flops 134 are reset by the reset signal that is sent from the control chip 100, and set to {000}. The communication circuit is set to a receiving state.

The memory chip m in a receiving state passes the 2 bits data "D1, D2" received from the memory chip m−1 (the memory chip 1 is the control chip 100: hereafter, referred to as "a preceding device", and the memory chip m+1 is referred to as "a latter device") to the combinational logic circuit 136.

The combinational logic circuit 136 determines the next internal state based on the information {000} and the above-mentioned 2 bits data "D1, D2".

When the 2 bits data "D1, D2" is "00", the internal state maintains the receiving state {000}.

Moreover, when the "D1, D2" is "01", "11", and "10", the internal states changes to a transfer state {001}, a selection preparatory state {010}, and a sleep preparatory state {100} respectively.

Transfer State {001}:

The communication circuit 120 in a transfer state {001} functions as a transfer (relay) circuit, and sends a 2 bits data "D1, D2" received from the preceding device to the latter device.

And the state information is maintained {001} for all the 2 bits data "D1, D2".

Selection Preparatory State {010}:

A selection preparatory state {010} is a state of a preparatory step to change own memory chip to a selective state in which read/write operation is possible when a 2 bits data "00" is received. When the communication circuit 120 in the selection preparatory state received a 2 bits data "01", "11", or "10" from the preceding device, it maintains the state information in the selection preparatory state {010}, and transmits the received 2 bits data "D1, D2" to the latter device.

When it received a 2 bits data "00" from the preceding device, it changes the internal states to a selective state {011} in which read/write operation of memory cell is possible, and transmits the 2 bits data "00" to the latter device.

Selective State {011}:

A selective state {011} is an operating state in which read/write of a memory cell is possible.

The communication circuit 120 set to the selective state {011} does not change the internal state by the 2 bits data "D1, D2" received from a preceding device, nor transmits the 2 bits data "D1, D2" to the latter device.

Sleep Preparatory State {100}:

A sleep preparatory state {100} is a state of a preparatory step for changing to a sleep state that has small power consumption by stopping functions except the minimum function such as a function that resets own memory chip when the communication circuit received a 2 bits data "00".

When a 2 bits data "D1, D2" that the communication circuit 120 received from the preceding device is "01", "11", or "10", it maintains the state information in the sleep preparatory state {100}, and transmits the received 2 bits data "D1, D2" to the latter device.

By receiving a 2 bits data "00" from preceding device, it sets the internal state to a sleep state {110} that has small power consumption, and transmits the 2 bits data "00" to the latter device.

Sleep State {110}:

A memory chip in the sleep state {110} stops functions except the minimum function portions such as a reset circuit, and lowers power consumption.

An operation to receive a 2 bits data "D1, D2" from the preceding device is also stopped.

A memory chip in the selective state {011} receives a read/write control signal and an address signal output from the control chip 100 through a communication path that the control chip 100 set by transmitting the 2 bits data "D1, D2", and according to the received read/write control signal, reads data from a memory domain indicated by the address signal, and transmits it to the control chip 100 through the above-mentioned communication path.

Or, it writes data that the control chip 100 transmitted through the above-mentioned communication path in a memory domain indicated by the address signal.

The memory chips stacked between the control chip 100 and a memory chip set in a selective state {011} are set to a transfer state {001}.

The memory chips set to the transfer state {001} relay an address and data, etc. exchanged between the control chip 100 and the memory chip that is set to the selective state {011}.

Figure 5:
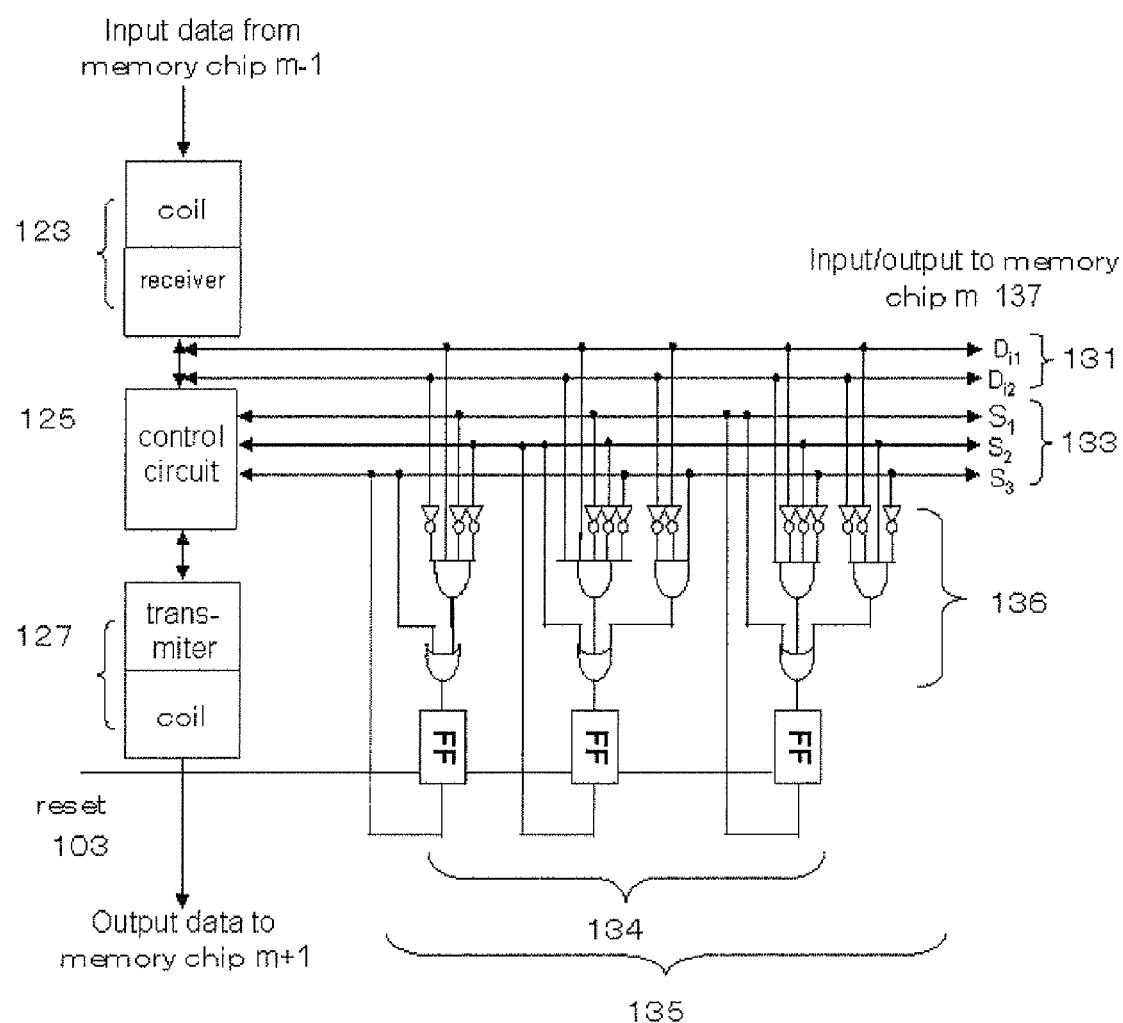
[FIG. 5] A figure showing an example of a sequential logic circuit of the first embodiment.

FIG. 5 shows an example of a sequential logic circuit that realizes a state transition shown in FIG. 4.

The sequential logic circuit 135 is constituted with the flip-flops 134 and the combinational logic circuit 136.

The flip-flops 134 are circuits to store the state information {S1, S2, S3}, reset by the reset signal 103 from the control chip 100, and are set to {000}, that is to say to a receiving state {000}.

The combinational logic circuit 136 performs a logical operation with the 3 bits output {S1, S2, S3} of the flip-flops 134 and the 2 bits data "D1, D2" that the receiving circuit 123 received from the preceding device by the combinational logic circuit 136 shown in FIG. 5, and stores the result to the flip-flops 134.

Figure 6:
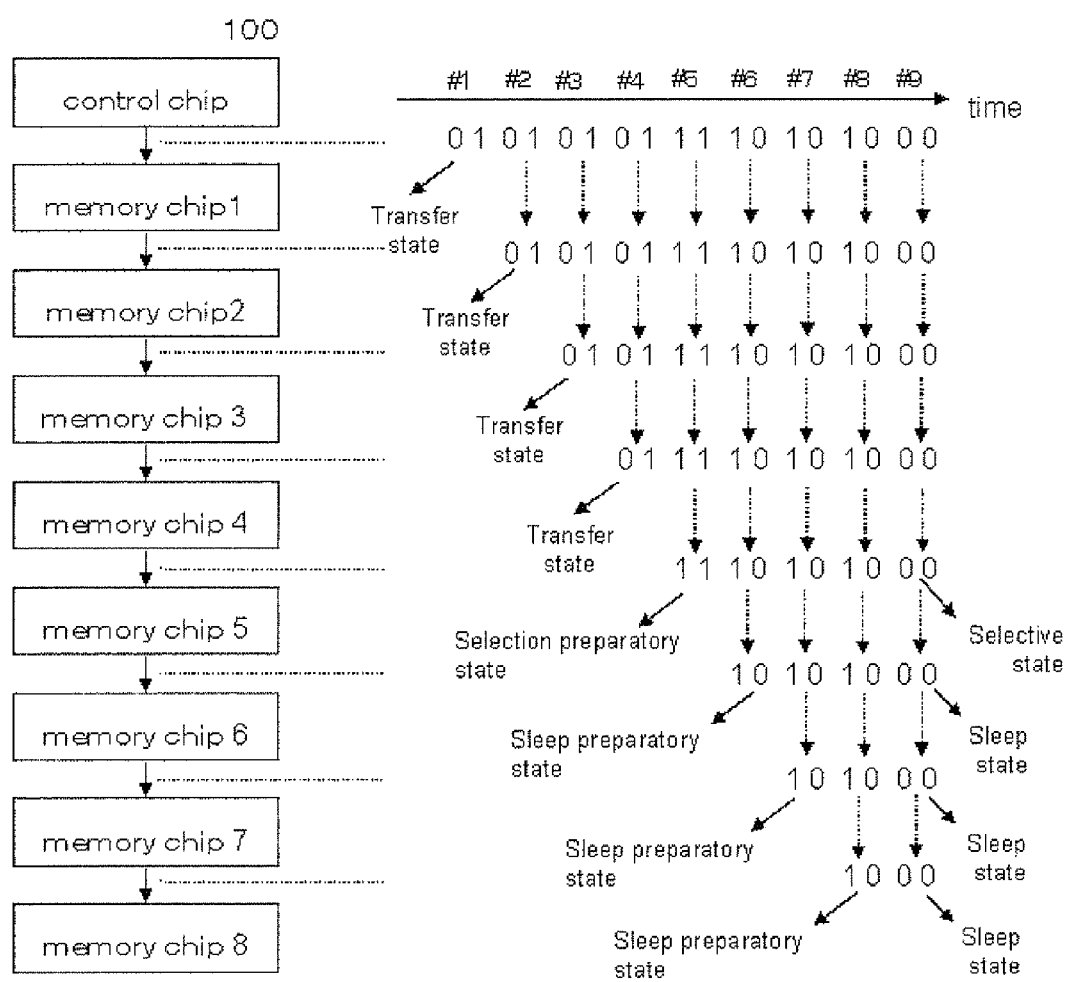
[FIG. 6] A figure showing a sequence of the first embodiment.

FIG. 6 shows a procedure, in a memory system that stacked eight memory chips, for executing read/write of data to a predetermined memory chip, for example, to a memory chip 5, to set the memory chip 5 to a selective state.

When starting a setting of states of memory chips, the control chip 100 sends the reset signal 103 to all the memory chips, and sets the memory chips to a receiving state {000}.

The First Step (#1):

The control chip 100 transmits a 2 bits data "01", to change the memory chip 1 to a transfer state.

By receiving the 2 bits data "01", the memory chip 1 that is in a receiving state {000} changes to the transfer state {001}.

The Second Step (#2):

The control chip 100 transmits a 2 bits data "01", to change the memory chip 2 to a transfer state.

The memory chip I in the transfer state {001} transmits the 2 bits data "01" to the latter memory chip 2.

The memory chip 2 in a receiving state {000} changes to a transfer state {001}, by receiving the 2 bits data "01".

The Third Step (#3):

The control chip 100 transmits a 2 bits data "01", to change the memory chip 3 to a transfer state.

This 2 bits data "01" is transferred to the memory chip 3 through the memory chip 1 and the memory chip 2 that are in the transfer states {001}.

By receiving the 2 bits data "01", the memory chip 3 in a receiving state {000} changes to a transfer state {001}.

The 4th Step (#4):

The control chip 100 transmits a 2 bits data "01" to change the memory chip 4 to a transfer state.

The 2 bits data "01" transmitted by the control chip 100 is transferred to the memory chip 4 through the memory chips 1 to 3 that are in the transfer states {001}, and changes the memory chip 4 to a transfer state {001}.

The 5th Step (#5):

The control chip 100 transmits a 2 bits data "11" to set the memory chip 5 to a selection preparatory state.

This data is transferred to the memory chip 5 through the memory chips 1 to 4 that are in the transfer states {001}.

By receiving the 2 bits data "11", the memory chip 5 in the receiving state {000} changes to a selection preparatory state {010}.

The 6th Step (#6):

To set the memory chip 6 that does not participate in this read/write operation of the memory chip 5 to a sleep state, the control chip 100 at first transmits a 2 bits data "10" to set the memory chip 6 to a sleep preparatory state.

This data is transferred to the memory chip 6 through the memory chips 1 to 4 that are in the transfer states {001}, and the memory chip 5 that is in the selection preparatory state {010}.

By receiving the 2 bits data "10", the memory chip 6 in a receiving state {000} changes to a sleep preparatory state {100}.

The 7th Step (#7):

The control chip 100 transmits a 2 bits data "10", to set the memory chip 7 to a sleep preparatory state.

This data is transferred to the memory chip 7 through the memory chips 1 to 4 that are in the transfer states {001 }, the memory chip 5 that is in the selection preparatory state {010}, and the memory chip 6 that is in the sleep preparatory state {100}.

By receiving the 2 bits data "10", the memory chip 7 in a receiving state {000} changes to a sleep preparatory state {100}.

The 8th Step (#8):

The control chip 100 transmits a 2 bits data "10", to set the memory chip 8 to a sleep preparatory state.

This data is transferred to the memory chip 8 through the memory chips 1 to 4 that are in the transfer states {001}, the memory chip 5 that is in the selection preparatory state {010}, and the memory chip 6 and the memory chip 7 that are in the sleep preparatory state {100}.

By receiving the 2 bits data "10", the memory chip 8 in a receiving state {000} changes to a sleep preparatory state {100}.

The 9th Step (#9):

The control chip 100 transmits a 2 bits data "00" to change the memory chips in the selection preparatory state and the sleep preparatory state to a selective state and a sleep state respectively.

This 2 bits data "00" is transferred to the memory chip 5 through the memory chips 1 to 4 that are in the transfer states {001}.

By receiving the 2 bits data "00", the memory chip 5 in the selection preparatory state {010} changes to a selective state {011}, and transmits the 2 bits data "00" to the memory chip 6 of the latter stage.

By receiving the 2 bits data "00", the memory chip 6 in the sleep preparatory state {100} changes to a sleep state {110}, and transmits the 2 bits data "00" to the memory chip 7 of the latter stage.

The memory chip 7 and the memory chip 8 in the sleep preparatory state {100} perform the same operation as the memory chip 6, and change to sleep state {110}.

Through execution by the control chip 100 of each step 1 to 9 shown in FIG. 6, the memory chips 1 to 4 are set to the transfer state, the memory chip 5 is set to the selective state, and the memory chips 6 to 8 are set to the sleep state.

The control chip 100 that finished the above-mentioned setting transmits necessary information to access the memory chip 5, such as read/write control information, address information, etc.

Each chip of memory chips 1 to 4 set to the transfer state transfers (relays) data exchanged between the control chip 100 and the memory chip 5.

The memory chip 5 receives a read/write control signal and an address signal outputs from the control chip 100, reads data from a memory domain indicated by the address signal according to the read/write control signal, and transmits it to the control chip 100 through the above-mentioned communication path.

Or, writes data that the control chip 100 transmitted through the above-mentioned communication path in a memory domain indicated by the address signal.

This invention enables, in an electronic circuit device that stacks plural components such as memory chips having the same function, to select an arbitrary component among the stacked components without installing identification information to each component.

According to a configuration of the first embodiment of this invention, it is not necessary to set information for identifying components such as a stacking order to the components that are stacked.

Therefore, there is no limit to the number of the components that can be stacked, and it is possible to stack the arbitrary numbers of electronic circuits.

EMBODIMENT 2

Figure 7:
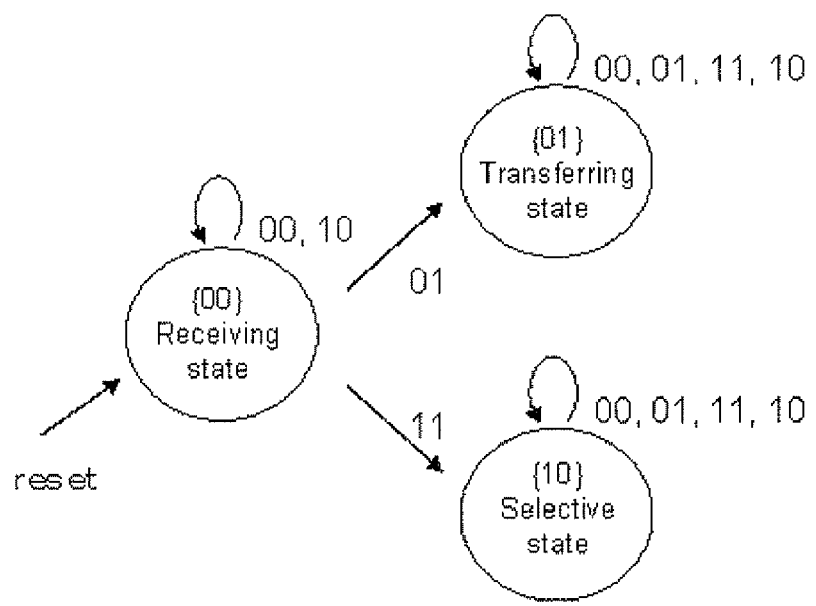
[FIG. 7] A state transition diagram of the second embodiment.

FIG. 7 is a state transition diagram of the second embodiment.

A configuration of the first embodiment is that the memory chips stacked on the latter stages of the memory chip set to a selective state, that is, when the number of stacked memory chips is n, and the m-th memory chip is selected, the memory chips m+1 to n are set to a sleep state, reducing power consumption.

When it isn't necessary to consider an amount of power consumption, it is possible to maintain the memory chips m+1 to n in the initial state, that is, the receiving state.

In such a case, the sleep preparatory state and the sleep state in the first embodiment are not necessary, as well as the selection preparatory state of the selected memory chip.

Therefore, in a configuration of the second embodiment, the states set to the stacked components are a receiving state, a transfer state, and a selective state, and state information, that is, the information stored in the flip-flops 134 of the sequential logic circuit 135 becomes 2 bits.

Receiving State {00}:

By the reset signal output from the control chip, state information of memory chips are reset to {00}, and communication circuits are in receiving states.

When a 2 bits data "D1, D2" from the preceding device is "01", the state information becomes {01}, and the memory chip changes to a transfer state.

When a 2 bits data "D1, D2" is "11", the state information becomes {10}, and the memory chip changes to a selective state.

Moreover, when "D1, D2" is "00" or "10", a receiving state {00} is maintained.

Transfer State {01}:

A memory chip in a transfer state {01} relays data that are exchanged between the preceding device and the latter device.

Selective State {10}:

A memory chip in a selective state {10} sets own memory circuits to the selective state that read/write is possible, and executes read/write of memory according to access information, such as address information, transmitted from the preceding device.

The memory chip in the selective state {10} does not transmit the data transmitted from the preceding device to the latter device.

Therefore, the latter devices maintain the receiving state {00}.

As well as the first embodiment, the second embodiment of this invention enables to stack the arbitrary number of components for constituting an electronic circuit with greater capability, without setting information for identifying components to the components which are to be stacked.

The second embodiment simplifies a configuration of the sequential logic circuit by reducing the number of states that are taken by the components, and enables to reduce the number of 2 bits data "D1, D2" that the control chip transmits for setting a state of each component.

Therefore, it is possible to reduce an amount of control and time required to set the electronic circuit device with stacked plural components to a target state.

EMBODIMENT 3

Figure 8:
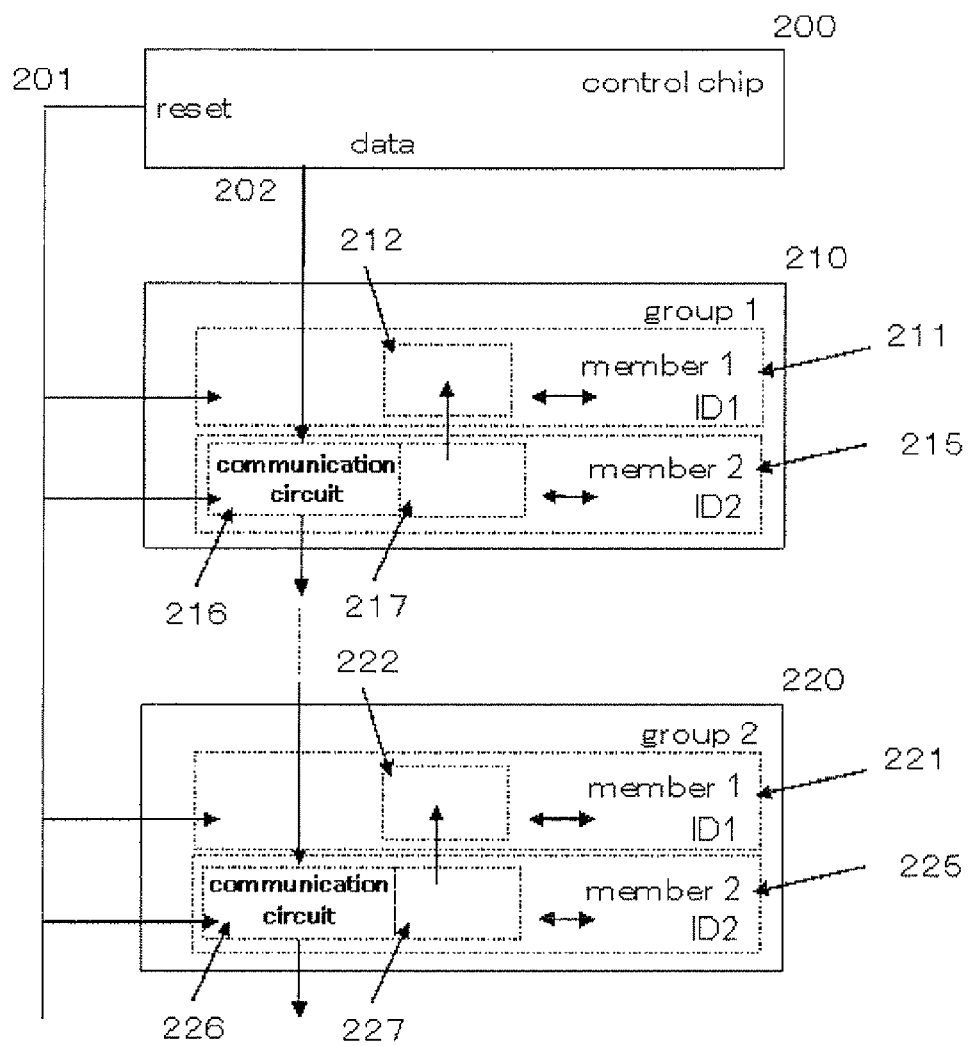
[FIG. 8] A figure showing an example of components stacked by the third embodiment.

FIG. 8 is a figure showing a configuration of the electronic circuit device by the third embodiment of this invention.

This embodiment is to compose a group by connecting the plural predetermined number of components (members).

Two groups 210 and 220 are shown in FIG. 8.

Each group consists of two members, for example, the group 210 consists of a member 211 and a member 215.

Identification information is given to each member.

In the example of this figure, "ID1" is given to the member 211 and "ID2" is given to the member 215.

The identification information is set to a component by a method of pre-assignment, or by a method of an automatic setting according to a component position in the group, etc.

This embodiment is to constitute an intended electronic circuit device by connecting plural groups in a cascade.

One member in each group (each member 2 of the group 1 and the group 2) has communication circuits 216 and 226 respectively, and connected in a cascade.

Output data 202 (2 bits data "D1, D2" in FIG. 1) to set a state from the control chip 200 is transmitted between communication circuits.

The communication circuits 216 and 226 have functions equivalent to the communication circuit of the first embodiment or the second embodiment, and determine own operational state by the 2 bits data "D1, D2" sent from the control chip 200.

The control chip 200 of this embodiment transmits ID information that indicates a member in a group, after setting of an operating state to each communication circuit is completed.

The communication circuits 216 and 226 have an indicating circuit 217 and 227 to indicate a member in the group based on the ID information transmitted from the control chip 200, when it is set to a selective state.

Members (the members 1 of the group 1 and the group 2) without communication circuits include operation control circuits 212 and 222 that control own operation (in the case of a memory chip, an access operation to a memory cell) according to indications of the indicating circuits.

As for members having communication circuits (the members 2 of the group 1 and the group 2), the indicating circuits 217 and 227 execute functions of operation control circuits.

When a communication circuit (for example, 226) set to a selective state receives ID information that the control chip 200 transmits through a communication circuit 216, the indicating circuit 227 identifies a member indicated by this ID information, and orders an operation control circuit of the corresponding member to respond to the access demand of the control chip 200.

After completing the identification of the group and the member of the group, the control chip 200 transmits control information for accessing a memory, such as an address of a memory cell, and a control signal of read/write.

The operation control circuit (or the indicating circuit) of the member indicated by the control chip 200 receives the above-mentioned control information, and executes the ordered operation.

Operation control circuits in other members transmit the operation control information transmitted by the control chip 200 to the latter members.

In the configuration of the third embodiment, a communication circuit is installed in each group.

The selection operation by the control chip 200 is to indicate a member in a group after selecting the group.

Therefore, the total of the number of groups and the number of members in a group is sufficient for selection operations by the control chip 200 that transmits state data and ID information. So that a high-speed selection operation is possible.

Moreover, the necessary number of communication circuits is the number of groups, so that a simplification of the configuration and a reduction of power consumption are possible.

EMBODIMENT 4

Figure 9:
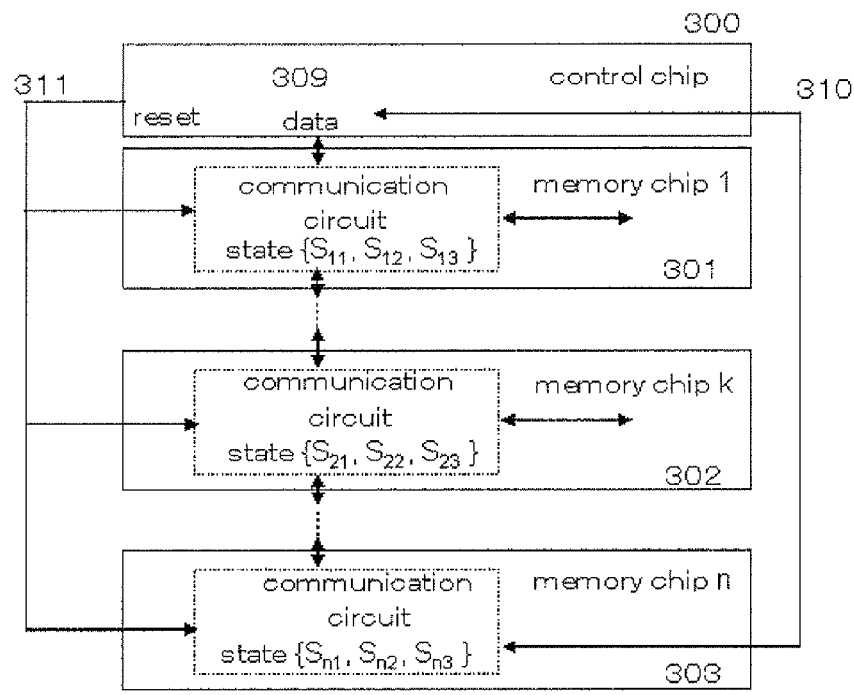
[FIG. 9] (a) is a figure showing an example of components stacked by the 4th embodiment, (b) is a figure showing the details of a component of the 4th embodiment
Figure 9:
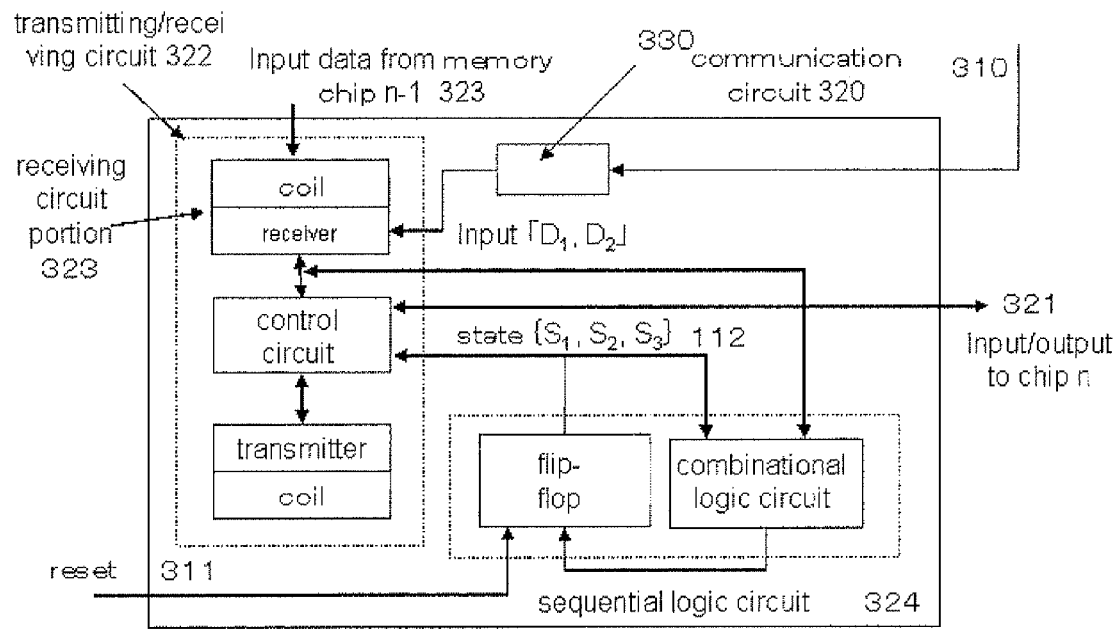

FIG. 9(*a*) is a figure showing a configuration of an electronic circuit device of the 4th embodiment of this invention, and FIG. 9(*b*) is a figure showing a component stacked at the farthest position from a control element.

In this embodiment, using bonding wires, etc., a wire communication path is made between a control element (a control chip) and a component (that is, a memory chip n) stacked at the farthest position from the control element.

An electronic circuit device of this invention has a configuration that plural components (n pieces) are stacked in a vertical direction or in a lateral direction to the control chip i.e. control element, and the stacked components sequentially relays a signal from the above control chip.

Therefore, when a component located in the middle of the n components, for example, in the k-th component is damaged, and is unable to relay the signal from the control chip, the normally operational components k+1 to n are unable to be utilized.

In this embodiment, an input means 330 that directly receives a signal from the control chip 300 is installed in a receiving circuit portion 323 of the component stacked at the farthest position from the control element.

When the k-th component is damaged, and the control chip 300 detected that it is unable to communicate with the latter devices from this component, the control chip 300 controls the input means 330 of the component n, and sets it to pass the control data outputs from the control chip 300 through a control line 310 to the receiving circuit portion 323.

In the above-mentioned configuration, when the k-th component is damaged, the control chip 300 transmits data which should be transmitted from components 1 to k−1, through a data channel 309 to the component 1.

According to the same procedure of the first to the third embodiments, the component 1 relays the above-mentioned data to the component k−1 sequentially and sets operating state of each component.

The control chip 300 transmits data transmitted from the components k+1 to n to the component n through the data line 310.

The components k+1 to n relay the control information that the component n received through the data line 310 to the component k+1, using the configuration for changing a direction of data transmission explained in FIG. 3, and set the operating state of each component.

The 4th embodiment enables an electronic circuit device stacking plural components to transmit a control signal from the control element to the opposite direction of the direction at normal operation, from the component in the last stage of the stacked components.

When one of stacked components is damaged and is unable to transmit data between components, this configuration enables to continue to use normally operational components by transmitting the control signal from the control element to the opposite direction of the direction at normal operation from the component in the last stage.

By this configuration, it is possible to reduce lowering of the function by damages.

INDUSTRIAL APPLICABILITY

This invention is to constitute an electronic circuit device having an arbitrary capability by stacking the arbitrary number of components of the same function.

Moreover, the components to be stacked are the same structure, or are structures classified in two or three kinds.

This invention is to constitute a device by stacking the arbitrary number of components having the same function to a vertical direction or to a lateral direction, and does not depend on the function of the components.

Moreover, as a means for communication between stacked components, it is possible to use an arbitrary means, such as a mechanical connection by a connector or a contact point, or an optical coupling by a light emitting element and a light receiving element.

By a configuration of this invention, it is possible to add or delete a component without redesigning the component, and to change a capability of the entire device.

Moreover, it is not necessary to assign an identification number to each component, and cost reduction is possible.

Because the control element does not need to send information of the component to be selected to all the components, low power operation becomes possible.

Moreover, quantity of data that each component transmits is less, and a reduction of communication power consumption becomes possible.

By the first and the second embodiments of this invention, it is possible to constitute a stacked semiconductors device that enables to select and communicate with a desired semiconductor chip among semiconductor chips of the same function stacked in plural layers by using a wireless or wired communication, or a electronic circuit device that enables to select and communicate with a desired electronic circuit board among plural attachable/removable electronic circuit boards of the same function stacked in plural layers by using a wireless or wired communication.

By the third embodiment of this invention, it is possible to perform a selection operation in high speed by selecting a group and then selecting a member in the group using another means, in the case that it included many components.

By the 4th embodiment of this invention, by preparing a signal path for transmitting data from a control element to the most separated component, it is possible to operate normal components, even if some of the stacked components are damaged, and is impossible to relay data from the control element.

The first to the third embodiments are to stack the control element (the control chip) at the top section (or the last section) of the stacked plural components (memory chip etc.).

As other configurations, a configuration stacking components to a front direction and to a rear direction of the control element, and locating the control element in the intermediate section of the plural components is possible.

By this configuration, a distance between the control element and a component to be controlled, that is, the number of components to perform a transmission (relay) decreases, and it is possible to minimize an amount of control required to set the electronic circuit device to the target state, or time required to control.

Moreover, the first to the third embodiments are configurations that exchange data etc. between adjacent control element and component or between components.

However, as shown in FIG. 4 of the Patent Document 1, it is possible to exchange data etc. between elements stacked separately, using inductive coupling.

In this invention, it is also possible to constitute a configuration that a means of communication of the control element and the components exchange data etc. between elements stacked separately in a far position, and by this configuration, it is possible to minimize an amount of control required to set the electronic circuit device to the target state, or time required to control.

The embodiments written in this specification are of the configurations that data is exchanged between each component by inductive coupling.

As a configuration to exchange data, a configuration that components have a contact point that contacts with a component of a preceding stage and a component of a latter stage, and by stacking the components, the contact point of each component contacts each other and forms a data transfer path, or a data transfer path by a light emitting element and a light receiving element etc, are also possible There are following merits, using data transfer by inductive coupling.

For a coil used for inductive coupling, it is possible to apply an integrated circuit technology or technology of a printed circuit board, and it is not necessary to make a mechanical contact such as a connector or a through-hole via, and by this feature, it is possible to stack substrates with low cost and to realize low power consumption.

A device including a non-contact connector, for example, a non-contact memory card is realizable.

This invention is applicable not only in a technical field of large capacity memory device with stacked plural memory chips, but also to equipment that is constituted by stacking plural components of the same function to realize high throughput.

By applying to a memory field, following merits are obtained.

Especially, by applying to a memory (a nonvolatile memory or a random access memory), it is possible to achieve a large capacity or a multi-function capabilities.

The invention claimed is:

1. An electronic circuit device in which at least one control element and plural components of the same function are stacked, comprising:
each of said control element and said components includes a means for communication for exchanging data,
said control element includes a means for transmitting data to direct change of state of said components through said means for communication to one of said components,
each of said components includes a means for changing an operating state according to said data directing change of state transmitted from said control element or said component of a preceding stage, and
each of said components includes a means for transmitting said data directing change of state transmitted from said control element or said component of the preceding stage to a component of a latter stage through said means for communication,
wherein said operating state is at least one of:
a receiving state to receive said data directing to change state and to change the state of said component to said directed state,
a transmitting state to transmit said data directing to change state between preceding component and latter component, and
a selected state to performs directions of said control element.

2. An electronic circuit device as set forth in claim 1,
each of said components includes a means for storing state information indicating an operating state, and
a combination logic means for determining an operating state based on said data directing change of state and said state information stored in said means for storing state information.

3. An electronic circuit device as set forth in claim 2,
said control element includes a means for sending a reset signal to set said state information to an receiving state.

4. An electronic circuit device as set forth in claim 1,
each of said components includes plural members of the same function, and a means for selecting a member indicated by said control element.

5. An electronic circuit device as set forth in claim 2,
each of said components includes plural members of the same function, and a means for selecting a member indicated by said control element.

6. An electronic circuit device as set forth in claim 3,
each of said components includes plural members of the same function, and a means for selecting a member indicated by said control element.

7. An electronic circuit device as set forth in claim 1, including a second communication path communicating between said control element and the most separated component from said control element.

8. An electronic circuit device as set forth in claim 2, including a second communication path communicating between said control element and the most separated component from said control element.

9. An electronic circuit device as set forth in claim 3, including a second communication path communicating between said control element and the most separated component from said control element.

10. An electronic circuit device as set forth in claim 1,
said means for communication is a wireless connection means using inductive coupling between coils.

11. An electronic circuit device as set forth in claim 2,
said means for communication is a wireless connection means using inductive coupling between coils.

12. An electronic circuit device as set forth in claim 3,
said means for communication is a wireless connection means using inductive coupling between coils.

13. An electronic circuit device as set forth in claim 1,
each of said components is an attachable/removable electronic circuit board.

14. An electronic circuit device as set forth in claim 2, each of said components is an attachable/removable electronic circuit board.

15. An electronic circuit device as set forth in claim 3, each of said components is an attachable/removable electronic circuit board.

16. An electronic circuit device as set forth in claim 1, each of said components is a semiconductor chip.

17. An electronic circuit device as set forth in claim 2, each of said components is a semiconductor chip.

18. An electronic circuit device as set forth in claim 3, each of said components is a semiconductor chip.

19. An electronic circuit device as set forth in claim 16, said semiconductor chip is a memory chip.

20. An electronic circuit device as set forth in claim 17, said semiconductor chip is a memory chip.

21. An electronic circuit device as set forth in claim 18, said semiconductor chip is a memory chip.

22. An electronic circuit device as set forth in claim 1, said components are the same function and the same structure.

23. An electronic circuit device as set forth in claim 2, said components are the same function and the same structure.

24. An electronic circuit device as set forth in claim 3, said components are the same function and the same structure.

* * * * *